US012726013B2

(12) United States Patent
Zhong et al.

(10) Patent No.: US 12,726,013 B2
(45) **Date of Patent: *Sep. 1, 2026**

(54) LEAKAGE PROTECTION CIRCUIT AND LIGHTING SYSTEM

(71) Applicant: Silergy Semiconductor Technology (Hangzhou) LTD, Hangzhou (CN)

(72) Inventors: Yongyu Zhong, Hangzhou (CN); Longqi Wang, Hangzhou (CN)

(73) Assignee: Silergy Semiconductor Technology (Hangzhou) LTD., Hangzhou (CN)

( * ) Notice: Subject to any disclaimer, the term of this patent is extended or adjusted under 35 U.S.C. 154(b) by 375 days.

This patent is subject to a terminal disclaimer.

(21) Appl. No.: 18/506,370

(22) Filed: Nov. 10, 2023

(65) Prior Publication Data

US 2024/0170947 A1 May 23, 2024

(30) Foreign Application Priority Data

Nov. 22, 2022 (CN) ........................ 202211473874.X

(51) Int. Cl.

*H02H 3/00* (2006.01)
*G01R 31/52* (2020.01)
*H02H 1/00* (2006.01)
*H02H 3/32* (2006.01)
*H05B 45/50* (2022.01)

(52) U.S. Cl.

CPC ............. *H02H 3/325* (2013.01); *G01R 31/52* (2020.01); *H02H 1/0007* (2013.01); *H05B 45/50* (2020.01)

(58) Field of Classification Search

CPC ........................................................ H02H 3/16

See application file for complete search history.

(56) References Cited

U.S. PATENT DOCUMENTS

| | | | | |
|---|---|---|---|---|
| 6,075,716 | A | 6/2000 | He et al. | |
| 6,385,057 | B1 | 5/2002 | Barron | |
| 8,471,488 | B1 | 6/2013 | Hopkins et al. | |
| 8,797,696 | B2 * | 8/2014 | Huang | H02H 3/162 361/42 |
| 9,077,260 | B2 | 7/2015 | Zhao et al. | |
| 9,124,169 | B2 | 9/2015 | Garlow et al. | |
| 9,525,336 | B2 | 12/2016 | Huang | |
| 11,411,383 | B2 | 8/2022 | Wang et al. | |
| 11,588,317 | B2 * | 2/2023 | Hao | H02H 1/0007 |
| 2009/0243398 | A1 | 10/2009 | Yohanan et al. | |
| 2015/0207398 | A1 | 7/2015 | Proca | |
| 2015/0216007 | A1 | 7/2015 | Ferrara et al. | |
| 2017/0222424 | A1 * | 8/2017 | Fukuo | H02H 3/044 |
| 2018/0241195 | A1 | 8/2018 | Zhang | |
| 2022/0052521 | A1 * | 2/2022 | Yoon | H02H 9/046 |
| 2024/0365457 | A1 * | 10/2024 | Wu | H05B 47/183 |

FOREIGN PATENT DOCUMENTS

CN 108093534 A 5/2008

* cited by examiner

*Primary Examiner* — Stephen W Jackson

(57) ABSTRACT

A leakage protection circuit for a lighting system can include: a pull-down current generation circuit configured to generate a pull-down current flowing from a DC bus to a reference voltage; and a control circuit configured to control the pull-down current generation circuit to generate a varied pull-down current during an operating interval, and to determine whether leakage occurs in accordance with a change state of a detection voltage signal representative of a voltage on the DC bus in a detection time interval, where the detection time interval is within the operating interval.

20 Claims, 6 Drawing Sheets

LEAKAGE PROTECTION CIRCUIT AND LIGHTING SYSTEM

RELATED APPLICATIONS

This application claims the benefit of Chinese Patent Application No. 202211473874.X, filed on Nov. 22, 2022, which is incorporated herein by reference in its entirety.

FIELD OF THE INVENTION

The present invention generally relates to the field of power electronics, and more particularly to leakage protection circuits, leakage protection methods, and load driving circuitry.

BACKGROUND

A switched-mode power supply (SMPS), or a "switching" power supply, can include a power stage circuit and a control circuit. When there is an input voltage, the control circuit can consider internal parameters and external load changes, and may regulate the on/off times of the switch system in the power stage circuit. Switching power supplies have a wide variety of applications in modern electronics. For example, switching power supplies can be used to drive light-emitting diode (LED) loads.

DETAILED DESCRIPTION

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

During the assembly operation of loads (e.g., light-emitting diodes [LEDs]), electric leakage caused by man-made operations can occur, and users may mistouch conductive parts, thereby giving rise to the danger of electric shock. For example, in the field of lighting, two end caps of a lamp can respectively connect with a lamp socket of an AC input power. In the assembly process, when users insert one end cap of the lamp into the lamp socket, they may mistouch conductive parts of the other end cap of the lamp, which may not be inserted into the lamp socket, thereby giving rise to the danger of electric shock.

Accordingly, in a lighting system, leakage protection circuitry is essential. In the case of multiple light sources starting, an input inductance of the input terminal of the lighting system can be relatively large, and the leakage protection circuit can misjudge the leakage, thus triggering the leakage protection by mistake and resulting in the lighting system not operate. Therefore, a reliable leakage protection circuit to be provided in a lighting system, in order to achieve suitable leakage protection.

Figure 1:
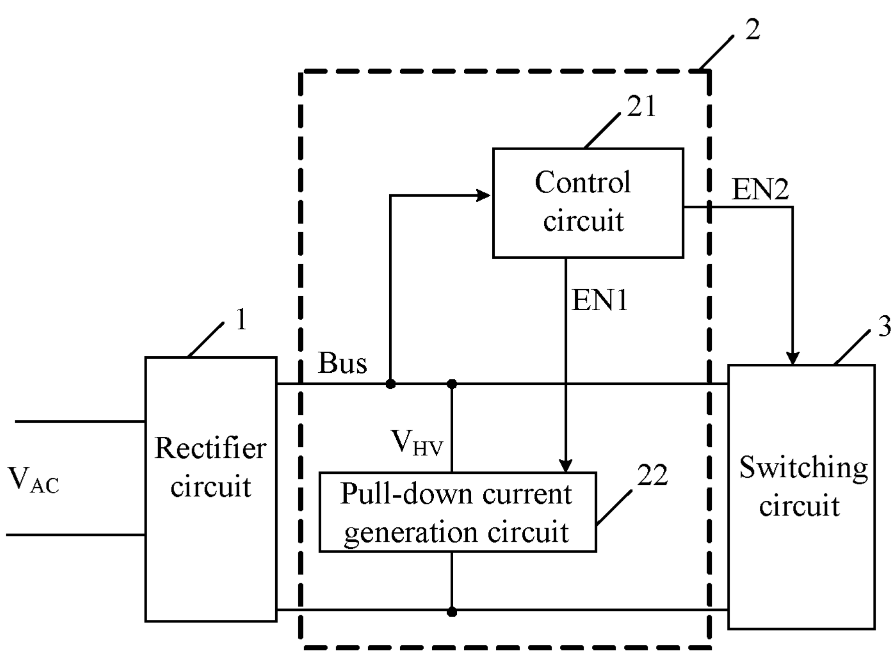
FIG. 1 is a schematic block diagram of a first example leakage protection circuit, in accordance with embodiments of the preset invention.

Referring now to FIG. 1, shown is a schematic block diagram of a first example leakage protection circuit, in accordance with embodiments of the preset invention. This particular example leakage protection circuit is applied to a lighting system, and the lighting system can include rectifier circuit 1 and switching circuit 3. Rectifier circuit 1 may receive an alternating current (AC) input voltage, and provide a rectified voltage signal to switching circuit 3 along a direct current (DC) bus (Bus). Switching circuit 3 may generate a corresponding DC voltage to provide energy for a light source. In this example, the light source can be a light-emitting diode (LED). The lighting system can also include leakage protection circuit 2, which can connect to the output terminals of the rectifier circuit, in order to provide reliable leakage protection when leakage occurs in the lighting system. For example, rectifier circuit 1 may be a full-bridge rectifier circuit, a half bridge rectifier circuit, or any other suitable rectifier circuit. Further, the switching circuit may be a flyback converter circuit, a buck converter circuit, a boost converter circuit, a buck-boost converter circuit, or a converter circuit of any other suitable topology type.

In one embodiment, the lighting system can also include a filter circuit, and the filter circuit can filter the output signal of rectifier circuit 1. Leakage protection circuit 2 can connect before or after the filter circuit. Leakage protection circuit 2 can include control circuit 21 and pull-down current generation circuit 22. Pull-down current generation circuit 22 can connect between output terminals of rectifier circuit 1 between the DC bus and the reference voltage (e.g., ground), and may provide a pull-down current flowing from the DC bus to the reference voltage. Pull-down current generation circuit 22 can generate a first pull-down current during a first operating interval, and a second pull-down current during a second operating interval. Control circuit 21 can sample a voltage across the DC bus to generate detection voltage signal $V_{HV}$, and may determine whether leakage occurs according to the change state of detection voltage signal $V_{HV}$ in a detection time interval, in order to control the operating state of switching circuit 3. Here, the first pull-down current can be greater than the second pull-down current, and the detection time interval may be within an operation interval that includes the first and second operating intervals.

In particular embodiments, the change rate of the detection voltage signal over time when leakage occurs can be greater than the change rate of the detection voltage signal over time when leakage does not occur. In certain embodiments, there are many ways to detect the change rate of detection voltage signal $V_{HV}$. In one example, whether leakage occurs can be determined by detecting the change rate of detection voltage signal $V_{HV}$ during a detection time interval that is included in the operating interval. For example, in the detection time interval, whether leakage occurs can be determined by comparing the detection voltage signal against a second threshold voltage. It should be understood that the change rate of detection voltage signal $V_{HV}$ over time may also be detected in other ways. Further, if leakage occurs, the lighting system may have no energy transfer to the load coupled to the output terminal thereof. For example, control circuit 21 can switching circuit 3 to not operate, such that no energy may be transferred to the load. If no leakage occurs, the lighting system can be allowed to transfer energy to the load or re-judge whether leakage occurs. Optionally, when no leakage occurs, the leakage protection circuit may determine whether leakage occurs for N times, where N is a positive integer. When the leakage protection circuit detects no leakage occurs after N times, energy can be allowed to be transferred to the load. If no leakage is detected after N times, energy can be allowed to be transferred to the load. Otherwise, energy may not be allowed to be transferred to the load. In this example, the leakage protection circuit can be set up multiple times to determine whether leakage occurs for many times. If no leakage occurs in the multiple detection results, energy can be allowed to be transferred to the load.

In particular embodiments, the operating interval can be a time interval where detection voltage signal $V_{HV}$ is less than a first voltage threshold. For example, a start time of the operating interval can be a moment that detection voltage signal $V_{HV}$ is less than the first voltage threshold. In the detection time interval, when the detection voltage signal remains less than the second voltage threshold, the leakage protection circuit can determine that leakage occurs. When the detection voltage signal is greater than the second voltage threshold, the leakage protection circuit may determine that no leakage occurs. Here, the detection time interval can be within the operating interval, the pull-down current may be switched from the first pull-down current to the second pull-down current in the detection time interval, and the second voltage threshold can be less than the first voltage threshold. For example, a start moment of the detection time interval may be later than a start moment of the operating interval by a first time period. After a second time period from the start moment of the operating interval, the pull-down current can be switched, and the second time period can be greater than the first time period.

In particular embodiments, leakage protection circuit in the embodiments of the invention may form a separate closed-loop circuit from the DC bus through the rectifier circuit, which can reduce energy loss and associated costs. In addition, the leakage protection circuit may provide different pull-down currents flowing from the DC bus to the ground in the first and second operating interval, respectively. This can smooth voltage mutation introduced by the input inductance at the AC input terminal, in order to avoid the false triggering of the leakage protection in multi-light source lighting system applications, and improve the reliability of the leakage protection circuit.

Figure 2:
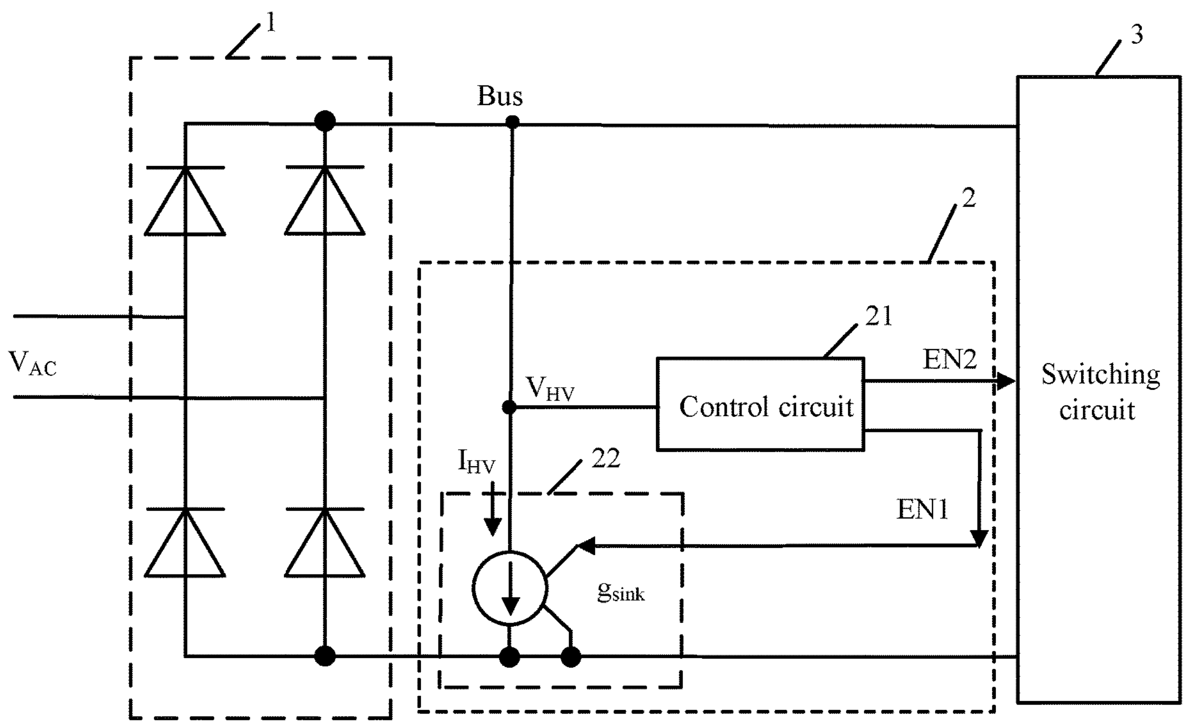
FIG. 2 is a schematic block diagram of a second example leakage protection circuit, in accordance with embodiments of the preset invention.

Referring now to FIG. 2, shown is a schematic block diagram of a second example leakage protection circuit, in accordance with embodiments of the preset invention. This example leakage protection circuit is applied to the lighting system. The leakage protection circuit can include control circuit 21 and pull-down current generation circuit 22. Pull-down current generation circuit 22 can include transconductance operational amplifier $g_{sink}$. A first input terminal of transconductance operational amplifier $g_{sink}$ may receive enable signal EN1. First and second output terminals of transconductance operational amplifier $g_{sink}$ can connect to the DC bus and the ground, respectively, which are the output terminals of the rectifier circuit. An active interval of enable signal EN1 can be configured as an operating interval. Control circuit 21 can control pull-down current generation circuit 22 to generate a first pull-down current in a first operating interval, and to generate a second pull-down current in a second operating interval. According to the change state of detection voltage signal $V_{HV}$ that characterizes the output voltage of the rectifier circuit, the leakage protection circuit may determine whether leakage occurs.

Control circuit 21 can detect detection voltage signal $V_{HV}$, and may generate enable signal EN1 according to detection voltage signal $V_{HV}$. When detection voltage signal $V_{HV}$ is less than a first voltage threshold, enable signal EN1 can change from an inactive state to an active state, which is a start moment of the operating interval (e.g., the first operating interval). Pull-down current generation circuit 22 may generate pull-down current I1 during the first operating interval, and pull-down current I2 during the second operating interval. In the detection time interval, control circuit 21 can determine whether leakage occurs according to detection voltage signal $V_{HV}$. If detection voltage signal $V_{HV}$ is not greater than the second voltage threshold, it can be determined that leakage occurs and no energy may be transmitted to the load. If detection voltage signal $V_{HV}$ is greater than the second voltage threshold, it can be determined that no leakage occurs, and energy can be allowed to be transmitted to the load.

In particular embodiments, the detection time interval can be within the operating interval, the pull-down current may be switched from pull-down current I1 to pull-down current I2 within the detection time interval, and the second voltage threshold can be less than the first voltage threshold. When control circuit 21 determines that leakage occurs, control signal EN2 can be generated to control switching circuit 3 to stop transmitting energy to the load. When control circuit 21 determines that no leakage occurs, control signal EN2 may be generated to control switching circuit 3 to transmit energy to the load.

In particular embodiments, the pull-down current generation circuit can control pull-down current I1 to switch to pull-down current I2 in the detection time interval, which can smooth the voltage mutation introduced by the input inductance at the AC input terminal, in order to change the change trend of the voltage on the DC bus. This can avoid false triggering of the leakage protection in the multi-light source lighting system, and improve the reliability of the leakage protection circuit. In one example, pull-down current I1 is a constant current, and pull-down current I2 is a constant current less than pull-down current I1. In another example, pull-down current I2 is a linearly decreasing current. In other examples, pull-down current I2 can also be a stepped reduced current.

For example, the first input terminal of transconductance operational amplifier $g_{sink}$ can receive enable signal EN1, and the second input terminal of transconductance operational amplifier $g_{sink}$ can be grounded. In other examples, the first input terminal of transconductance operational amplifier $g_{sink}$ can receive enable signal EN1, and the second input terminal of transconductance operational amplifier can receive other voltage signal(s). Further, pull-down current generating circuit 22 can include a transistor. A control terminal of the transistor can receive enable signal EN1, and the first and second power terminals of the transistor can respectively be connected to the DC bus and the ground.

That is, the transistor can connect between the output terminals of rectifier circuit 1. In this example, the active interval of enable signal EN1 may be configured as the operating interval. It should be understood that the transistor may be a metal-oxide-semiconductor (MOS) transistor, or a triode, and so on. Further, transconductance operational amplifier $g_{sink}$ may also include transistors.

For example, the start moment of the operating interval can be a moment when the detection voltage signal falls to the first voltage threshold. Particular embodiments may provide three different ways to control the end moment of the operating interval. In a first way, the end moment of the operating interval may be a moment when the pull-down current falls to a first current threshold. In a second way, the end moment of the operating interval may be a moment when the detection voltage signal reaches a third voltage threshold for the second time, and the third voltage threshold is less than the second voltage threshold. In a third way, the end moment of the operating interval may be a moment when the start moment of the operating interval is delayed by a preset time period.

In particular embodiments, the active interval of the first enable signal can be configured as the operating interval. That is, the first enable signal can change from an inactive state to an active state at the start moment of the operating interval, and the first enable signal can change from an active state to an inactive state at the end moment of the operating interval. Further, the end moment of the detection time interval may be consistent with the end moment of the operating interval, and the start moment of the detection time interval can be later than the start moment of the operating interval. For example, the start moment of the detection time interval may be a moment that delays the start moment of the operating interval by a first time period.

Figure 3A:
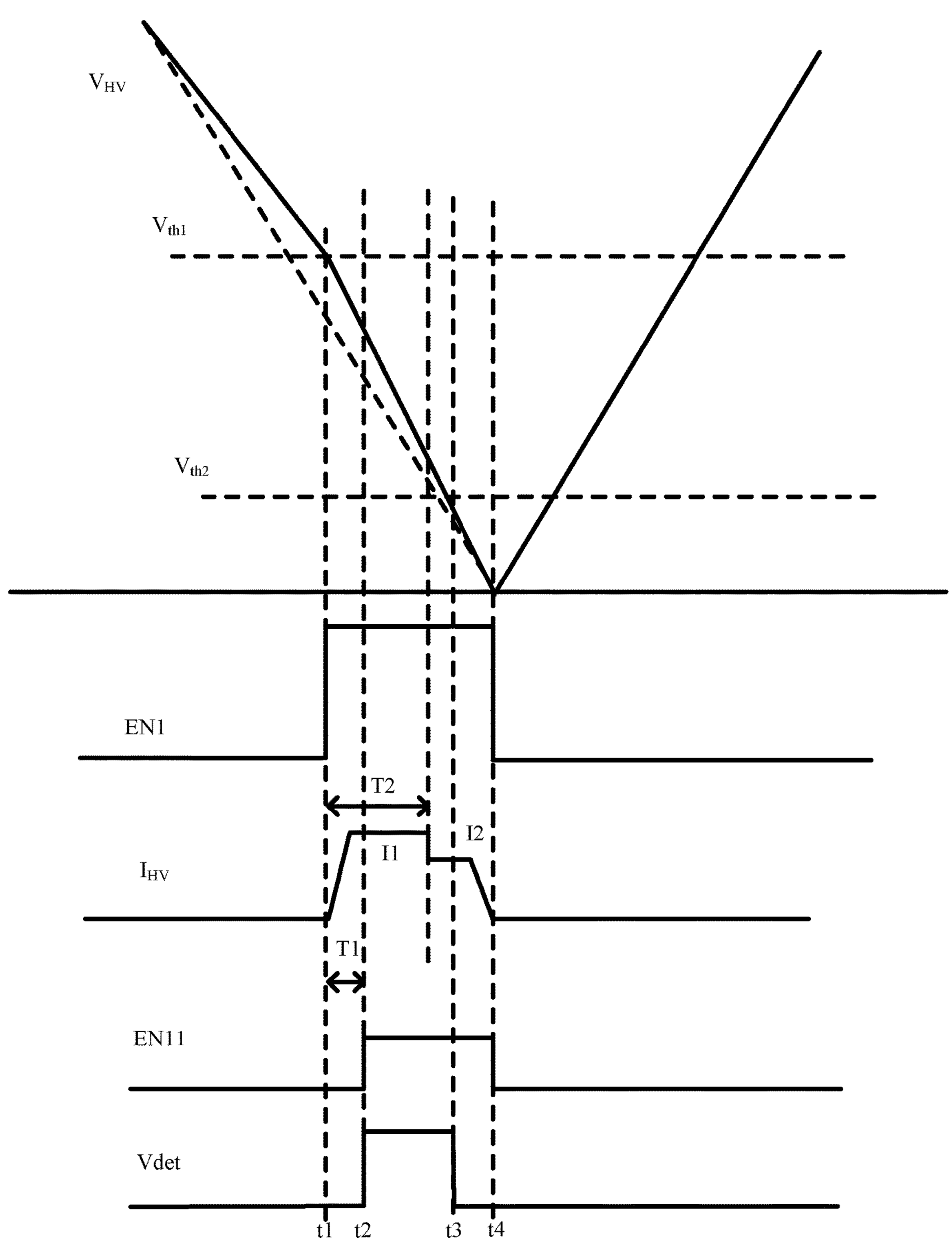
FIGS. 3A and 3B are waveform diagrams of a first example operation of the leakage protection circuit, in accordance with embodiments of the preset invention.
Figure 3B:
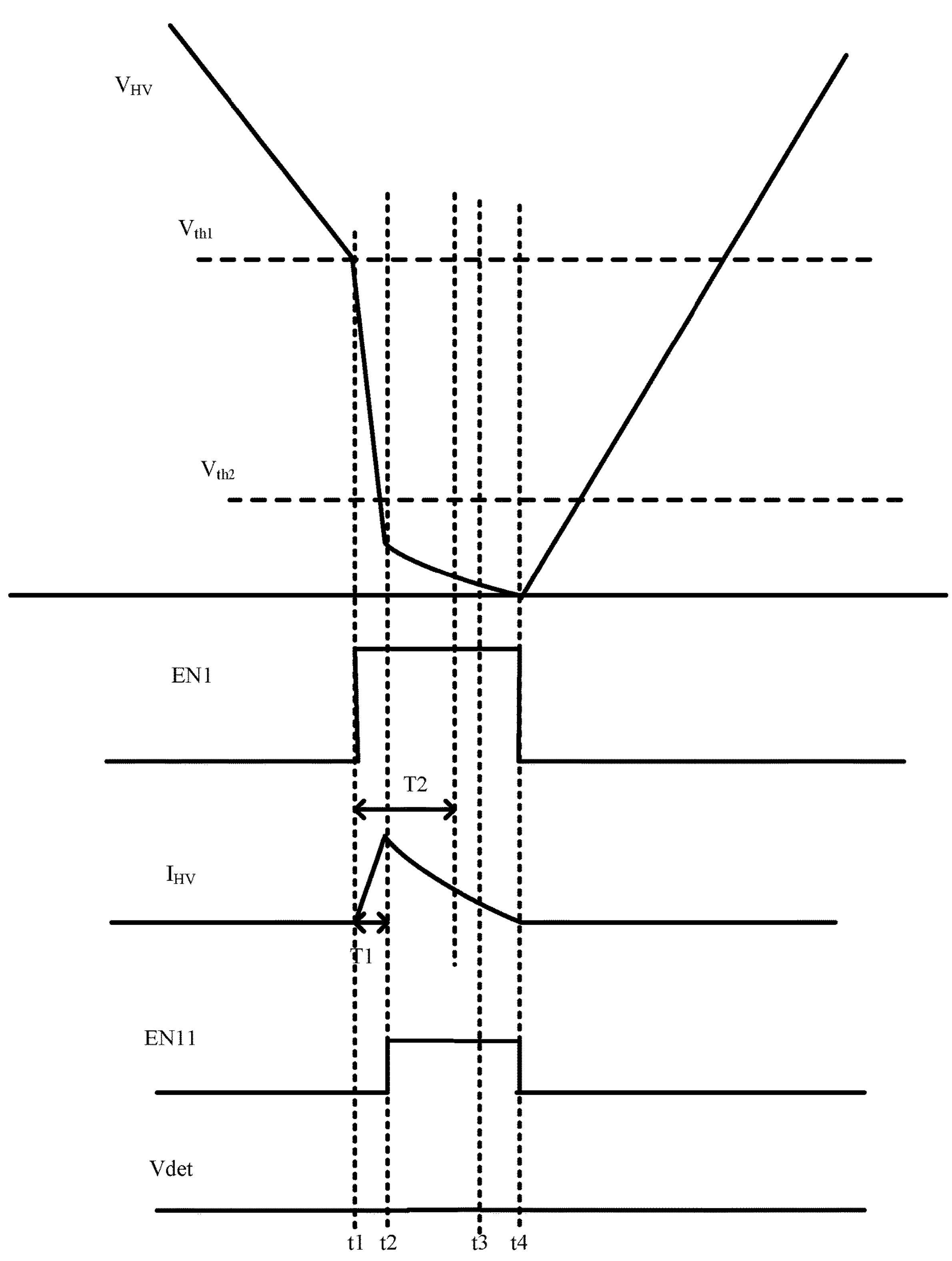

Referring now to FIGS. 3A and 3B, shown are waveform diagrams of a first example operation of the leakage protection circuit, in accordance with embodiments of the preset invention. The active interval of enable signal EN1 can be configured as the operating interval, and an end moment of the operating interval may be a moment when pull-down current I2 falls to a first current threshold (e.g., zero), meanwhile enable signal EN1 can change from an active state to an inactive state. An active interval of enable signal EN11 can be configured as the detection time interval, and a start moment of enable signal EN11 may be later than the start moment of enable signal EN1 by time period T1. Signal Vdet can be generated by comparing the detection voltage signal against voltage threshold Vth2 in the detection time interval, in order to determine whether leakage occurs. In the detection time interval, signal Vdet can be at a high level when detection voltage signal $V_{HV}$ is higher than voltage threshold Vth2, and signal Vdet can be at a low level when detection voltage signal $V_{HV}$ is not greater than voltage threshold Vth2. Therefore, it can be directly seen from signal Vdet whether leakage occurs in the lighting system. If signal Vdet is at a high level, this can indicate that no leakage occurs. If signal Vdet does not have a high level, that is, signal Vdet is always a low level in the detection time interval, this can indicate that leakage occurs.

In these examples, FIG. 3A shows operation waveforms when leakage occurs, and FIG. 3B shows waveforms when no leakage occurs. At time t1, enable signal EN1 can be switched to be active, and pull-down current $I_{HV}$ in the first operating interval of the operating interval is pull-down current I1. After time period T1, that is, at time t2, enable signal EN11 can be activated and the detection time interval is entered. Enable signal EN11 can be generated based on enable signal EN1. For example, enable signal EN11 can be activated when a start moment of enable signal EN1 is delayed by time period T1, and deactivated when enable signal EN1 is deactivated. After time period T2, the second operating interval of the operating interval may be entered, and pull-down current $I_{HV}$ switched to be pull-down current I2. At time t4, pull-down current $I_{HV}$ may drop to zero, and enable signals EN1 and EN11 may both be deactivated. In the active interval of enable signal EN11, that is, in the detection time interval, signal Vdet can be a high level between time t2-t3, in order to determine that the input inductance of the lighting system is zero, the human body does not contact the input terminal of the lighting system, and no leakage occurs. In this example, the active interval of enable signal EN1 is a high level, while in other examples the active interval of first enable signal can be a low level.

As shown in FIG. 3A, since it takes time for the detection voltage signal to drop to voltage threshold Vth2, in practical applications, the start moment of the detection time interval is a moment that delays start moment t1 of the operating interval by time period T1, that is, time t2. The end moment of the detection time interval may be the same as the end moment of the operating interval, that is, time t4. Therefore, the start moment of the active interval of enable signal EN11 may be later than the start moment of the active interval of enable signal EN1 by time period T1, and the end moment of the active interval of enable signal EN11 may be the same as the end moment of the active interval of enable signal EN1. The pull-down current generation circuit can control the pull-down current to jump from pull-down current I1 to pull-down current I2 in detection time interval t2-t4. When detection voltage signal $V_{HV}$ drops to a small value, the loop formed by the pull-down current generation circuit from the DC bus through the rectifier circuit may not achieve closed-loop control, and pull-down current $I_{HV}$ may drop to zero in the form of a sine curve following the voltage on the DC bus.

As shown in FIG. 3B, at start moment t2 of the detection time interval, that is, the start moment of the active interval (e.g., high level) of enable signal EN11, since detection voltage signal $V_{HV}$ is relatively small, the loop formed by the pull-down current generation circuit from the DC bus through the rectifier circuit may not achieve closed-loop control, pull-down current $I_{HV}$ may begin to drop, and the voltage on the DC bus may drop to zero in a linear form. In the detection time interval (e.g., time t2-t4), detection voltage signal $V_{HV}$ may be less than threshold Vth2, and signal Vdet may remain at a low level. Therefore, it can be determined that inductance of the lighting system is large, the human body contacts the input terminal of the lighting system, and leakage occurs.

Figure 4A:
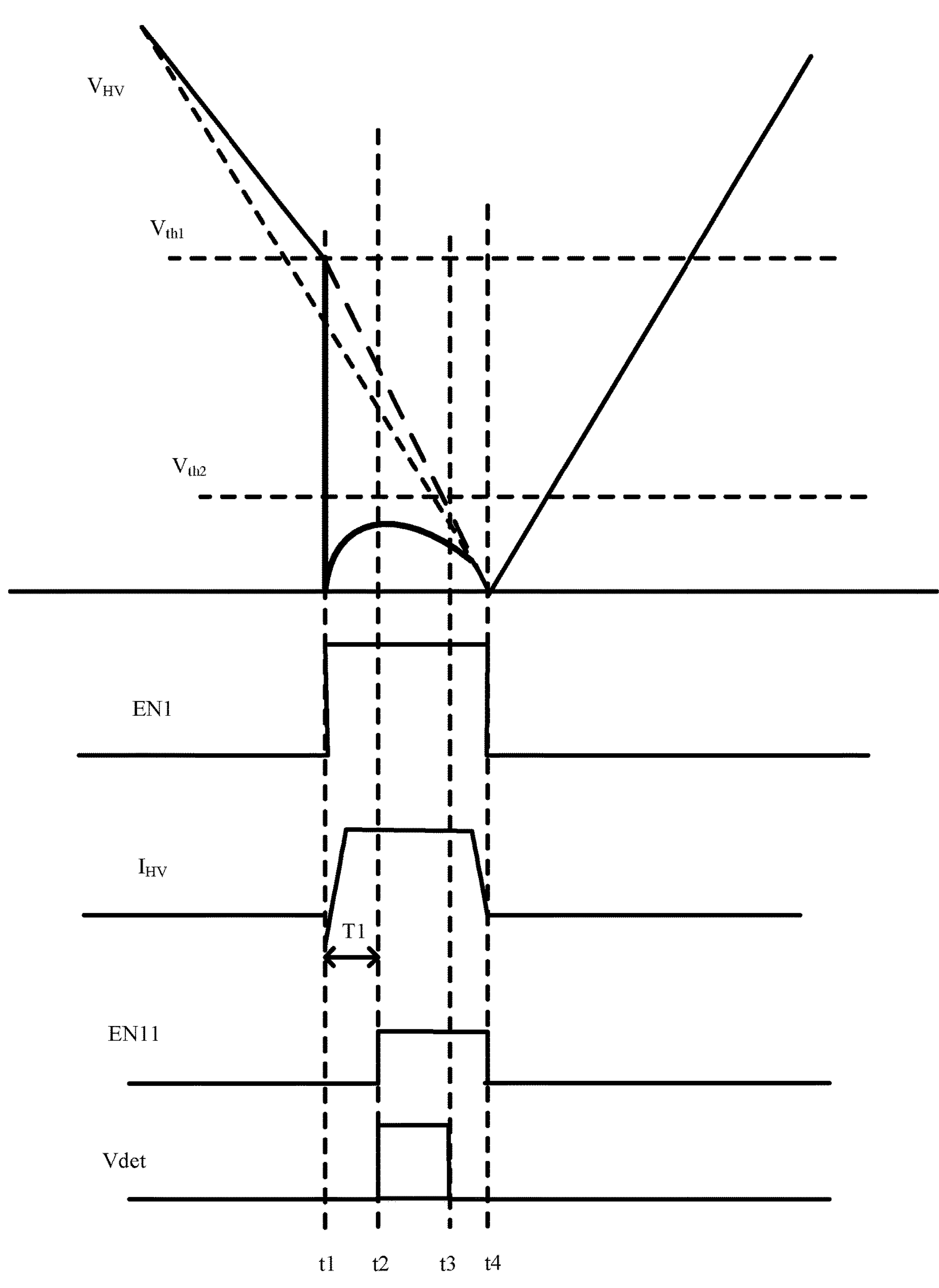
FIGS. 4A and 4B are waveform diagrams of a second example operation of the leakage protection circuit, in accordance with embodiments of the preset invention.
Figure 4B:
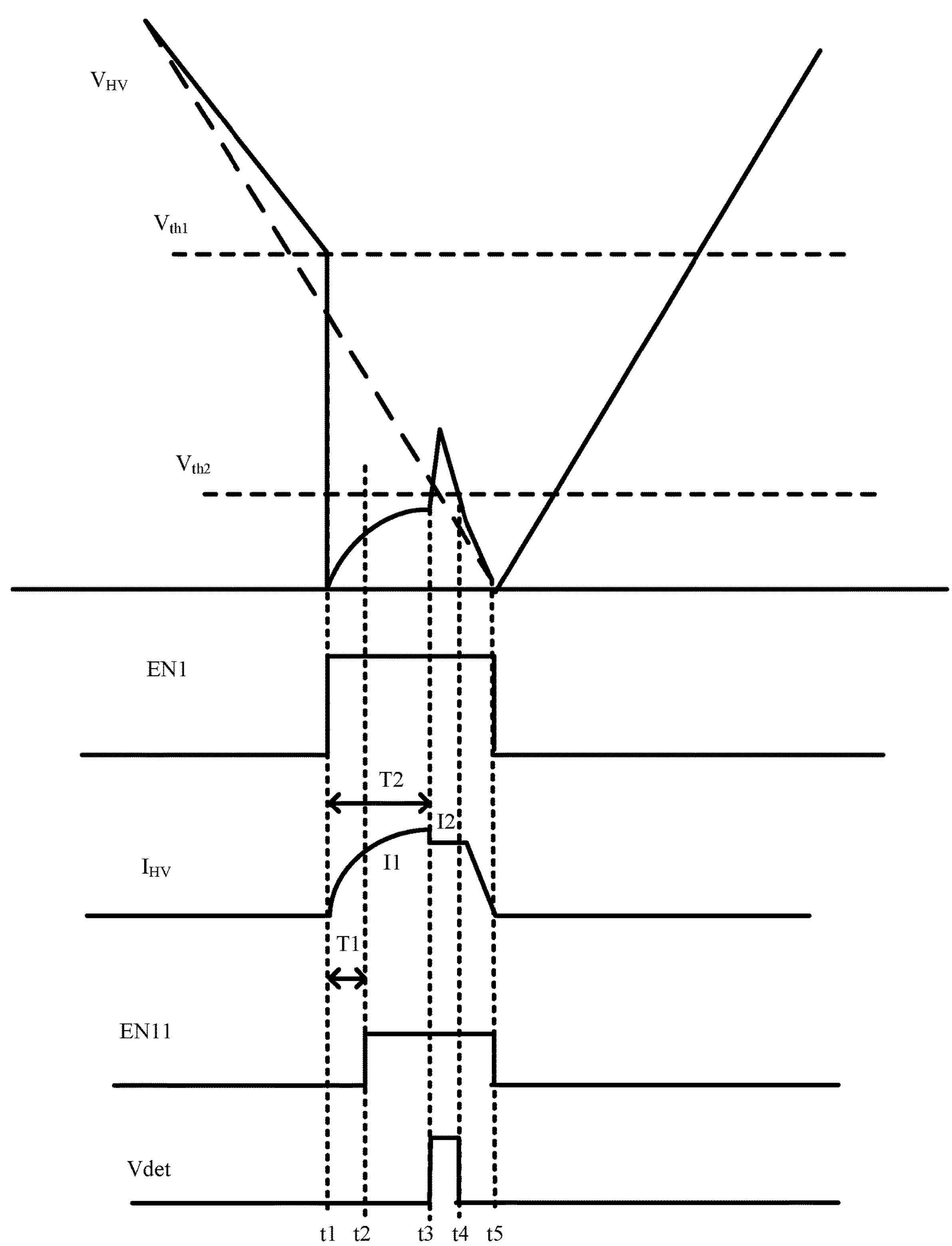

Referring now to FIGS. 4A and 4B, shown are waveform diagrams of a second example operation of the leakage protection circuit, in accordance with embodiments of the preset invention. In FIGS. 4A and 4B, multiple lighting systems can connect in parallel to the AC input terminal of the AC voltage, multiple light sources start operating, and the input inductance at the AC input terminal of the lighting system is large. In FIG. 4B, the leakage protection circuit in particular embodiments is adopted, and the pull-down current can be varied within the detection time interval. For comparison, the leakage protection circuit in FIG. 4A May provide a constant pull-down current within the operating interval. It can be seen that due to the different pull-down currents, the leakage judgment results are completely different.

The active interval of the first enable signal EN1 can be configured as the operating interval, and an end moment of the operating interval may be a moment when pull-down current I2 falls to the first current threshold (e.g., zero), meanwhile enable signal EN1 can be changed from an active state to an inactive state. An active interval of enable signal EN11 can be configured as the detection time interval, and a start moment of the detection time interval can be later than the start moment of enable signal EN1 by time period T1, that is, the start moment of the detection time interval is later than the start moment of the operating interval by time period T1. Signal Vdet can be generated by comparing the detection voltage signal against voltage threshold Vth2 in the detection time interval to determine whether leakage occurs. In the detection time interval, signal Vdet can be at a high level when detection voltage signal $V_{HV}$ is higher than voltage threshold Vth2, and signal Vdet can be at a low level when detection voltage signal $V_{HV}$ is not greater than voltage threshold Vth2. Therefore, it can be directly seen from signal Vdet whether leakage occurs in the lighting system. If signal Vdet has a high level, this can indicate that no leakage occurs. If signal Vdet does not have a high level, that is, signal Vdet is always low in the detection time interval, this can indicate that leakage occurs.

In FIGS. 4A and 4B, due to the large input inductance, detection voltage signal $V_{HV}$ initially drops to zero at time t1, and then rises slowly. Due to the different pull-down currents, detection voltage signals $V_{HV}$ as shown in FIGS. 4A and 4B can be varied in different forms, so the leakage protection circuit may provide completely different leakage determination results. In FIG. 4A, at time t1, enable signal EN1 may be activated. In the operating interval, that is, in the active interval of enable signal EN1, the leakage protection circuit may provide constant pull-down current $I_{HV}$. After time period T1, that is, at time t2, enable signal EN11 can be activated and the detection time interval entered. Due to the large input inductance, detection voltage signal $V_{HV}$ can initially drop to zero at time t1, and then slowly rise, resulting in detection voltage signal $V_{HV}$ being less than threshold Vth2, and signal Vdet being low. Therefore, the leakage protection circuit can determine that the human body contacts the input terminal of the lighting system by mistake, and mistakenly determine that leakage occurs.

As shown in FIG. 4B, at time t1, enable signal EN1 may be activated, and pull-down current $I_{HV}$ in the first operating interval of the operating interval is pull-down current I1. Due to the large input inductance, detection voltage signal $V_{HV}$ may initially drop to zero at time t1, then slowly rise, and pull-down current I1 may also rise slowly. After time period T1, that is, at time t2, enable signal EN11 can be activated and the detection time interval entered. After time period T2, that is, at time t3, the second operating interval of the operating interval can be entered, and pull-down current $I_{HV}$ may be switched to be pull-down current I2.

At time t5, pull-down current $I_{HV}$ drops to zero, enable signals EN1 and EN11 can both be switched to be inactive. In the active interval of enable signal EN11, that is, in the detection time interval, signal Vdet can be at a high level between time t3-t4, in order to determine that the input inductance of the lighting system is zero, indicating that the human body does not contact the input terminal of the lighting system, and no leak occurs. During the detection time interval, pull-down current $I_{HV}$ can decrease from pull-down current I1 to pull-down current I2. Due to the influence of the input inductance, detection voltage signal $V_{HV}$ may go upward, such that detection voltage signal $V_{HV}$ is greater than threshold Vth2, and signal Vdet is switched to be a high level. Therefore, it can be determined that the input inductance of the lighting system is zero, and the human body does not contact the input terminal of the lighting system, and no leakage occurs. In this way, the leakage protection circuit can smooth the voltage mutation introduced by the input inductance of the AC input terminal by controlling the pull-down current to be changed, thereby avoiding the false triggering of the leakage protection in the multi-light source lighting system and improving the reliability of the leakage protection circuit.

Particular embodiments may provide a separate closed-loop circuit through the leakage protection circuit from the DC bus through the rectifier circuit, which reduces the energy loss and the cost. In addition, the leakage protection circuit may provide different pull-down currents from the DC bus to the reference voltage in the first operating interval and the second operating interval of the operating interval, respectively, which can smooth the voltage mutation introduced by the input inductance of the input terminal, in order to avoid the false triggering of the leakage protection in the multi-light source lighting system and improve the reliability of the leakage protection circuit.

The embodiments were chosen and described in order to best explain the principles of the invention and its practical applications, to thereby enable others skilled in the art to best utilize the invention and various embodiments with modifications as are suited to particular use(s) contemplated. It is intended that the scope of the invention be defined by the claims appended hereto and their equivalents.

What is claimed is:

1. A leakage protection circuit for a lighting system, comprising:

a) a pull-down current generation circuit configured to generate a pull-down current flowing from a DC bus to a reference voltage; and b) a control circuit configured to control the pull-down current generation circuit to generate a varied pull-down current during an operating interval, and to determine whether leakage occurs in accordance with a change state of a detection voltage signal representative of a voltage on the DC bus in a detection time interval, wherein the detection time interval is within the operating interval.

2. The leakage protection circuit of claim 1, wherein when leakage occurs a change rate of the detection voltage signal is greater than the change rate of the detection voltage signal when leakage does not occur.

3. The leakage protection circuit of claim 1, wherein the operating interval is configured as a time interval where the detection voltage signal is less than a first voltage threshold.

4. The leakage protection circuit of claim 1, wherein in the detection time interval, the control circuit controls the pull-down current generation circuit to switch to a second pull-down current from a first pull-down current, and detects the detection voltage signal.

5. The leakage protection circuit of claim 1, wherein a start moment of the detection time interval is configured as a moment that delays a start moment of the operating interval by a first time period.

6. The leakage protection circuit of claim 3, wherein in the detection time interval:

a) when the detection voltage signal is not greater than a second voltage threshold, the leakage protection circuit determines that leakage occurs; and b) when the detection voltage signal is greater than the second voltage threshold, the leakage protection circuit determines that no leakage occurs.

7. The leakage protection circuit of claim 1, wherein an end moment of the detection time interval is consistent with an end moment of the operating interval.

8. The leakage protection circuit of claim 3, wherein an end moment of the operating interval is a moment when the pull-down current falls to a first current threshold.

9. The leakage protection circuit of claim 3, wherein an end moment of the operating interval is configured as a moment when the detection voltage signal reaches a third voltage threshold for the second time, and the third voltage threshold is less than a second voltage threshold.

10. The leakage protection circuit of claim 3, wherein an end moment of the operating interval is configured as a moment when the start moment of the operating interval is delayed by a preset time period.

11. The leakage protection circuit of claim 1, wherein the pull-down current generation circuit comprises a transconductance operational amplifier coupled between the DC bus and the reference voltage, and is configured to generate the varied pull-down current.

12. The leakage protection circuit of claim 1, wherein the pull-down current generation circuit comprises a transistor coupled between the DC bus and the reference voltage, and is configured to generate the varied pull-down current.

13. The leakage protection circuit of claim 1, wherein the transistor is configured as one of a MOSFET, a J-FET transistor, and a triode.

14. The leakage protection circuit of claim 1, wherein:

a) the varied pull-down current comprises a first pull-down current and a second pull-down current; and b) during the detection time interval, at least one switch occurs between the first pull-down current and the second pull-down current.

15. The leakage protection circuit of claim 14, wherein the first pull-down current is greater than the second pull-down current.

16. The leakage protection circuit of claim 14, wherein the pull-down current from the DC bus to the reference voltage is determined by the voltage on the DC bus and the expected value of the first pull-down current or the second pull-down current.

17. The leakage protection circuit of claim 1, wherein:

a) a first pull-down current is generated during a first operating interval;

b) a second pull-down current is generated during a second operating interval; and c) a start moment of the second operating interval is later than a start moment of the detection time interval.

18. The leakage protection circuit of claim 1, wherein when leakage occurs in the lighting system, in the operating interval the pull-down current is controlled to rise from zero and then drop to zero following the voltage on the DC bus.

19. An apparatus, comprising the leakage protection circuit of claim 1, and further comprising:

a) a rectifier circuit configured to receive an alternating current (AC) input voltage, and to provide a rectified voltage signal;

a) a switching circuit configured to receive the rectified voltage signal, and to drive a light source; and b) wherein the leakage protection circuit is coupled between the rectifier circuit and the switching circuit, and is configured to determine whether leakage occurs in an input terminal of the lighting system, in order to provide leakage protection.

20. The apparatus of claim 19, further comprising a filter circuit configured to filter the rectified voltage signal.

* * * * *